United States Patent [19]
Hodges et al.

[11] Patent Number: 5,192,707
[45] Date of Patent: Mar. 9, 1993

[54] METHOD OF FORMING ISOLATED REGIONS OF OXIDE

[75] Inventors: Robert Hodges, Euless; Frank Bryant, Denton, both of Tex.

[73] Assignee: SGS-Thomson Microelectronics, Inc., Carrollton, Tex.

[21] Appl. No.: 738,580

[22] Filed: Jul. 31, 1991

[51] Int. Cl.$^5$ .............................................. H01L 21/76
[52] U.S. Cl. ........................................ 437/70; 437/69; 437/46; 437/21; 437/25; 148/DIG. 117; 148/DIG. 15
[58] Field of Search ............... 437/69, 70, 46, 21, 437/24, 25, 95 G; 148/DIG. 15, DIG. 117

[56] References Cited

U.S. PATENT DOCUMENTS

| | | | |
|---|---|---|---|
| 4,016,007 | 4/1977 | Wada et al. | 437/69 |
| 4,407,696 | 10/1983 | Han et al. | 156/653 |
| 4,508,757 | 4/1985 | Fabricius et al. | 437/69 |
| 4,516,316 | 5/1985 | Haskell | 437/70 |
| 4,564,394 | 1/1986 | Bussmann | 437/69 |
| 4,630,356 | 12/1986 | Christie et al. | 437/69 |
| 5,002,898 | 3/1991 | Fritzinger et al. | 437/69 |

OTHER PUBLICATIONS

Article in J. Electrochem. Soc.: Solid-State Science & Technology, vol. 129, No. 8, Aug. 1982, "The Oxidation Inhibition in Nitrogen-Implanted Silicon".
Article in J. Electrochem. Soc.: vol. 138, No. 7, Jul. 1991, "Twin-White-Ribbon Effect & Pit Formation Mechanism in PBLOCOS" by Tin-Hwang Lin et al.

*Primary Examiner*—Brian E. Hearn
*Assistant Examiner*—Trung Dang
*Attorney, Agent, or Firm*—Lisa K. Jorgenson; Richard K. Robinson

[57] ABSTRACT

A method is provided for forming isolated regions of oxide of an integrated circuit, and an integrated circuit formed according to the same. A pad oxide layer is formed over the integrated circuit. A nitrogen doped polysilicon layer is formed over the pad oxide layer. A thick nitride layer is then formed over the nitrogen doped polysilicon layer. An opening is formed in the nitride layer and the nitrogen doped polysilicon layer exposing a portion of the pad oxide layer. The nitrogen doped polysilicon layer is annealed encapsulating the polysilicon layer in silicon nitride. A field oxide region is then formed in the opening.

18 Claims, 1 Drawing Sheet

METHOD OF FORMING ISOLATED REGIONS OF OXIDE

FIELD OF THE INVENTION

The present invention relates generally to semiconductor integrated circuits, and more specifically to forming isolated regions of oxide.

BACKGROUND OF THE INVENTION

The trend to continue to miniaturize semiconductor integrated circuits to achieve submicron feature sizes and increase the number of devices fabricated on the integrated circuit has required smaller isolation areas between devices. Active areas in which devices are built are isolated by a layer of oxide known as field oxide. The introduction of LOCOS, local oxidation of silicon, produces regions of insulating silicon dioxide between devices. The LOCOS process was a great technological improvement in reducing the area needed for the isolation regions and decreasing some parasitic capacitances.

In LOCOS, silicon nitride is deposited and patterned over a stress relief pad oxide layer. The silicon nitride layer is retained over the area over which further oxidation is not desired. Thus, the silicon nitride is etched to expose a portion of the pad oxide where the field oxide is to be grown. After the thermal oxidation of the exposed pad oxide to form the field oxide regions, the silicon nitride layer is removed.

Several problems occurred, however, with LOCOS. Non-uniform thermal oxidation of a wafer surface, in the original LOCOS form, always incurred lateral encroachment, or tapering of the field oxide into the active areas growing under the silicon nitride mask. This tapering effect, called "birdbeaking" is a sacrifice of active areas that becomes significant for feature sizes less than 1.5 microns. The active area becomes smaller than the initial dimensions of the nitride layer. Attempts to suppress birdbeaking such as forming thicker nitride layers, caused stress-related defects in the nearby substrate. Process complexity also increased substantially in attempting to avoid these stress-related defects. To achieve submicron geometries, there can be little or no physical loss of the active areas as occurs with the birdbeaking phenomenon.

To reduce the bird's beak effect, there has been proposed the use of a polysilicon layer between the nitride layer and the pad oxide layer as more fully described in U.S. Pat. No. 4,407,696, issued Oct. 4, 1983 to Han et al. The use of the polysilicon layer in the LOCOS process, known as poly-buffered LOCOS, is used to reduce oxidation induced stacking faults resulting from the stress caused by the different thermal coefficients of expansion between the silicon substrate and a thick silicon nitride layer overlying the substrate.

The field oxide layer grown using poly-buffered LOCOS thus comprises the oxide derived from the silicon substrate, a portion of the pad oxide layer and the oxide derived from the polysilicon layer. Afterwards, the nitride layer, the polysilicon layer and the pad oxide are etched at the edges of the field oxide. The poly-buffered LOCOS process reduced the bird's beak area over standard LOCOS resulting in less encroachment of the tapered portion of the field oxide into the active areas under the nitride mask. However, the bird's beak effect still remained, due to the oxidation of the polysilicon layer. In addition, the complexity of the process increased substantially in order to achieve the resulting structure.

In order to further decrease the bird's beak area using polybuffered LOCOS, the present invention uses a nitrogen implant into the polysilicon layer followed by an annealing step to encapsulate the polysilicon layer in silicon nitride. As with standard polybuffered LOCOS, the stress caused between the thick nitride layer over a thin pad oxide and the silicon substrate is reduced by the addition of the polysilicon layer. In addition, the bird's beak area is substantially reduced due to the encapsulation of the polysilicon in silicon nitride. The oxidation of the polysilicon is reduced or eliminated. None of the polysilicon layer thus forms any part of the thermally grown field oxide. The resulting bird's beak area under the nitride mask is thus substantially reduced.

SUMMARY OF THE INVENTION

The invention may be incorporated into a method for forming an integrated circuit, and the integrated circuit formed thereby, by forming isolated regions of oxide. A pad oxide layer is formed over the integrated circuit. A polysilicon buffer layer is formed over the pad oxide layer. Nitrogen is implanted into the polysilicon buffer layer. A nitride layer is then formed over the polysilicon buffer layer. A photoresist layer is applied and patterned over the nitride layer to form an opening exposing a portion of the nitride layer. The nitride layer and the polysilicon buffer layer are etched through the opening exposing a portion of the pad oxide layer. The polysilicon buffer layer is then annealed encapsulating the polysilicon layer in silicon nitride. A field oxide region is then formed in the opening.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
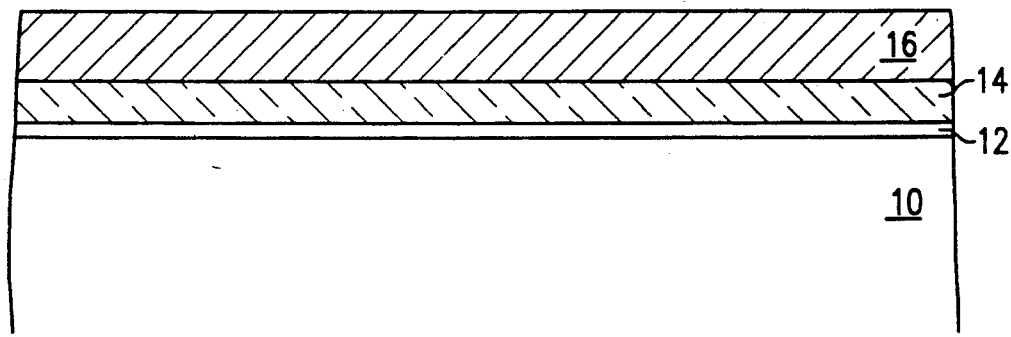
FIGS. 1–3 are cross-sectional views of the fabrication of a semiconductor device structure according to the present invention.
Figure 2:
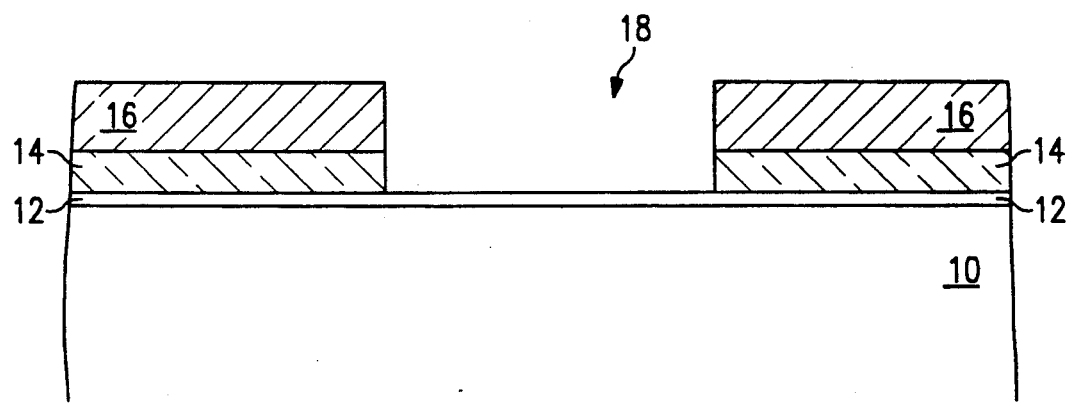
Figure 3:
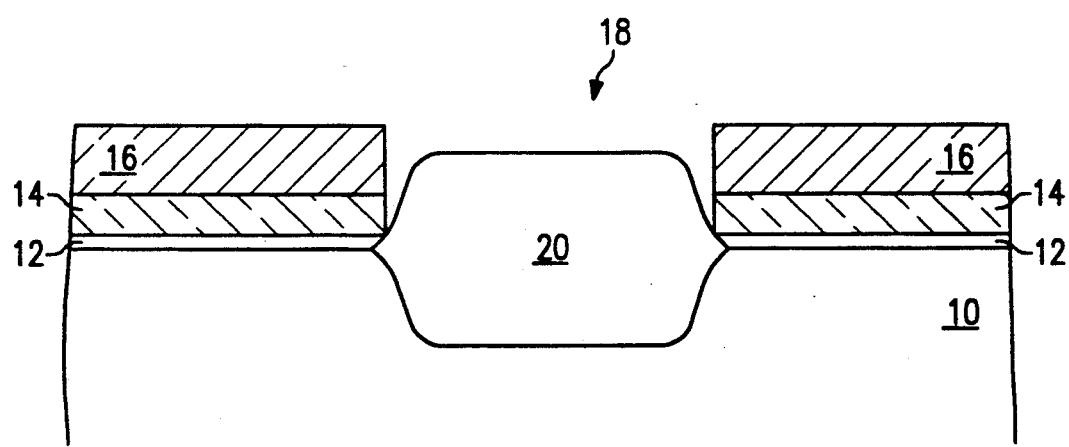

Referring to FIG. 1, an integrated circuit is to be formed on a silicon substrate 10. A stress relief pad oxide layer 12 is grown over the substrate 10. The pad oxide layer 12 will typically have a thickness of between approximately 10 and 300 angstroms. A polysilicon buffer layer 14 is deposited over the pad oxide layer 12. The thickness of the polysilicon layer 14 will be between approximately 50 and 1000 angstroms.

The polysilicon layer 14 is next implanted with nitrogen with a dosage of between approximately $10^{14}$ to $10^{16}$ ions per centimeter squared. A nitride layer 16 (Si$_3$N$_4$) is deposited over the nitrogen implanted polysilicon buffer layer 14. The thickness of the nitride layer 6 will be between approximately 500 and 3000 angstroms. The nitride layer 16 and the polysilicon buffer layer 14 are patterned and etched to form an opening 18 exposing a portion of the pad oxide layer 12. The pad oxide layer 12 may be etched away with the nitride and polysilicon. However, the benefit of retaining the pad oxide layer is that it acts as an etch stop for the nitride layer 16 and polysilicon layer 14 etch. At this stage, an implant into the silicon substrate 10 may be done to form a channel stop. If an implant is done, the ions will have sufficient energy to penetrate the pad oxide layer 12, thus the implant will occur only through the opening 18.

The polysilicon buffer layer 14 is annealed to encapsulate layer 14 in silicon nitride. The annealing process may be done in a furnace. Furnace annealing will typically take approximately one hour at 1000° C. in an ambient such as argon or nitrogen. The annealing process drives the nitrogen to the interface of the polysilicon layer 14 with the layers adjoining the polysilicon layer. A silicon nitride like compound is formed through this process. Field oxide region 20 is then thermally grown in opening 18. The field oxide layer 20 will typically have a thickness of between approximately 3000 and 8000 angstroms.

Encapsulating the nitrogen implanted polysilicon layer 14 in silicon nitride through the annealing process prevents the polysilicon from oxidizing during growth of the field oxide region 20. The polysilicon layer 14 acts to relieve stress between a thicker nitride layer 16 and the silicon substrate 10. The polysilicon prevents the thicker nitride layer overlying the polysilicon from inducing defects in the silicon substrate. In addition, penetration of the grown oxide beneath the nitride mask is reduced. The bird's beak area is substantially reduced due to the inability of the polysilicon to oxidize during growth of the field oxide region. The nitride layer 16 and polysilicon buffer layer 14 may then be removed to expose the active areas underneath.

What is claimed is:

1. A method of forming isolated regions of oxide of an integrated circuit comprising the steps of:
    forming a pad oxide layer over the integrated circuit;
    forming a polysilicon buffer layer over the pad oxide layer;
    implanting nitrogen into the polysilicon buffer layer;
    forming a nitride layer over the polysilicon buffer layer;
    applying and patterning a photoresist layer over the nitride layer to form an opening exposing a portion of the nitride layer;
    etching the nitride layer and the polysilicon buffer layer through the opening exposing a portion of the pad oxide layer;
    annealing the polysilicon buffer layer encapsulating the polysilicon buffer layer in silicon nitride; and,
    forming a field oxide region in the opening.

2. The method of claim 1, wherein the thickness of the pad oxide layer is between approximately 10 and 300 angstroms.

3. The method of claim 1, wherein the thickness of the polysilicon buffer layer is between approximately 50 and 1000 angstroms.

4. The method of claim 1, wherein the nitrogen is implanted into the polysilicon buffer layer at a dosage of approximately $10^{14}$ to $10^{16}$ ions per centimeter squared.

5. The method of claim 1, wherein the polysilicon buffer layer is annealed by furnace annealing.

6. The method of claim 5, wherein the nitrogen implanted polysilicon buffer layer is annealed at approximately 1000° C. for approximately one hour.

7. The method of claim 1, wherein the polysilicon buffer layer is annealed in an argon ambient.

8. The method of claim 1, wherein the polysilicon buffer layer is annealed in a nitrogen ambient.

9. The method of claim 1, wherein the thickness of the nitride layer is between approximately 500 to 3000 angstroms.

10. The method of claim 1, wherein the thickness of the field oxide layer is between approximately 3000 to 8000 angstroms.

11. The method of claim 1, further comprising the step of implanting a dopant to form a channel stop under the pad oxide layer before the forming a field oxide region step.

12. A method of forming isolated regions of oxide of an integrated circuit comprising the steps of:
    forming a pad oxide layer over the integrated circuit;
    forming a nitrogen doped polysilicon layer over the pad oxide layer;
    forming a nitride layer over the nitrogen doped polysilicon layer;
    forming in the nitrogen doped polysilicon and nitride layers exposing a portion of the pad oxide layer;
    annealing the nitrogen doped polysilicon layer to encapsulate the nitrogen doped polysilicon layer in silicon nitride; and,
    forming a field oxide region in the opening.

13. The method of claim 12, wherein the forming the nitrogen doped polysilicon layer comprises the steps of:
    forming a polysilicon layer; and,
    implanting nitrogen into the polysilicon layer.

14. The method of claim 12, wherein the nitrogen doped polysilicon layer is annealed by furnace annealing.

15. The method of claim 14, wherein the nitrogen doped polysilicon layer is annealed at approximately 1000° C. for approximately one hour.

16. The method of claim 12, wherein the nitrogen doped polysilicon layer is annealed in an argon ambient.

17. The method of claim 12, wherein the nitrogen doped polysilicon layer is annealed in a nitrogen ambient.

18. The method of claim 12, further comprising the step of implanting a dopant to form a channel stop under the pad oxide layer before the forming a field oxide region step.

* * * * *

UNITED STATES PATENT AND TRADEMARK OFFICE
CERTIFICATE OF CORRECTION

PATENT NO. : 5,192,707
DATED : March 9, 1993
INVENTOR(S) : Robert Hodges, et. al.

It is certified that error appears in the above-indentified patent and that said Letters Patent is hereby corrected as shown below:

In column 4, claim 12, line 37, after "forming"

add --an opening--.

Signed and Sealed this

Fourteenth Day of January, 1997

Attest:

BRUCE LEHMAN

*Attesting Officer*     *Commissioner of Patents and Trademarks*